United States Patent [19]
Golemon

[11] Patent Number: 4,943,342
[45] Date of Patent: Jul. 24, 1990

[54] COMPONENT FEEDING DEVICE FOR CIRCUIT BOARD MOUNTING APPARATUS

[76] Inventor: Valia S. Golemon, 1004 State Park Rd., Lockhart, Tex. 78644

[21] Appl. No.: 237,883

[22] Filed: Aug. 29, 1988

[51] Int. Cl.⁵ ............................................. B32B 31/16
[52] U.S. Cl. ................................... 156/584; 156/344; 226/62; 226/67
[58] Field of Search ................. 156/344, 584; 226/62, 226/67

[56] References Cited

U.S. PATENT DOCUMENTS 2,817,515 12/1957 Przysiecki ............................. 226/67
3,477,627 11/1969 Webers .............................. 226/67 X
4,193,834 3/1980 Bernardi ............................ 226/67 X
4,820,369 4/1989 Kubo .................................... 156/344

Primary Examiner—Robert A. Dawson
Attorney, Agent, or Firm—Fred N. Schwend

[57] ABSTRACT

An inexpensive device for acurately and intermittently feeding a component transporting tape to a pickup station of a circuit board assemblying apparatus wherein a yieldable actuator intermittently drives a tape feed pawl until stopped by an adjustable limit stop to precisely position each component. A takeup reel for removing a retainer strip from the transport tape is yieldably driven by the tape through a belt which is controlled by a constant tension device.

8 Claims, 2 Drawing Sheets

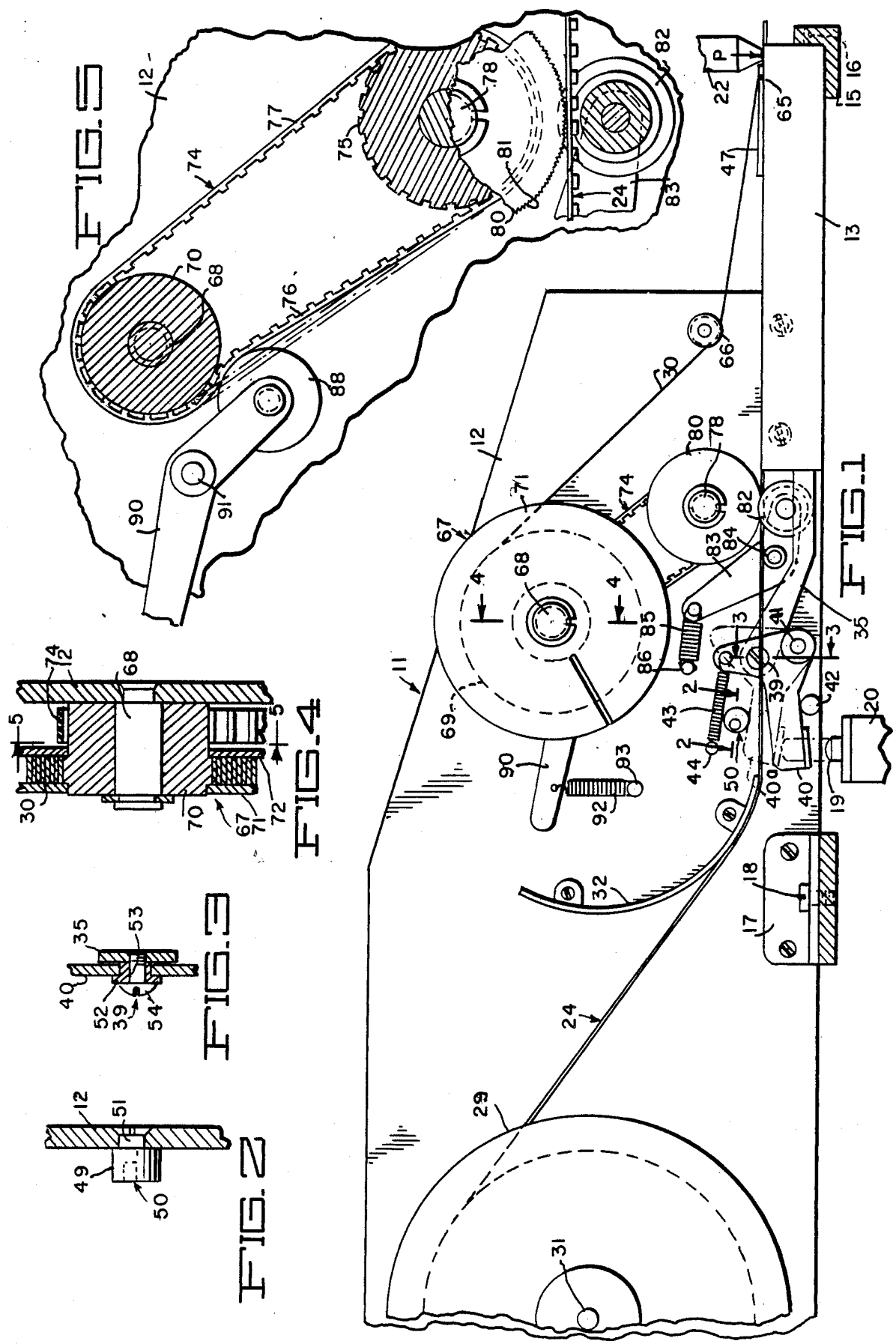

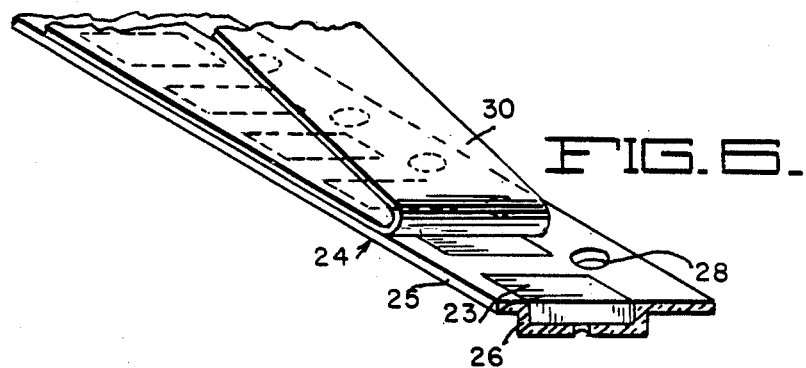
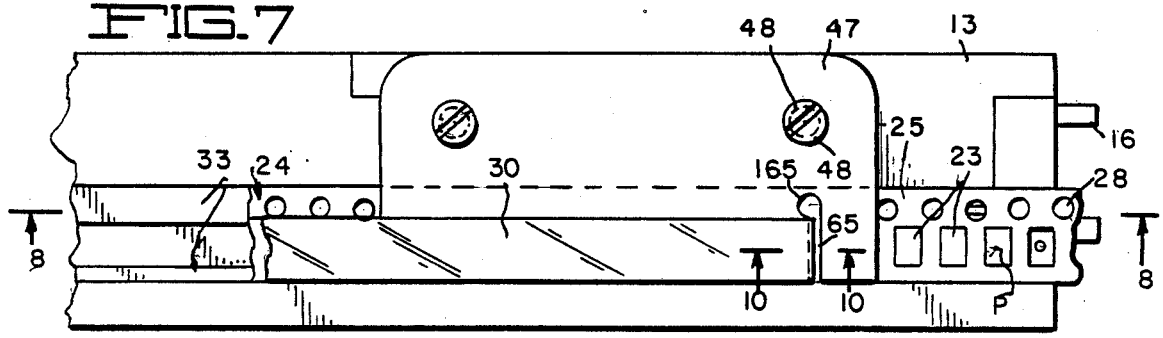
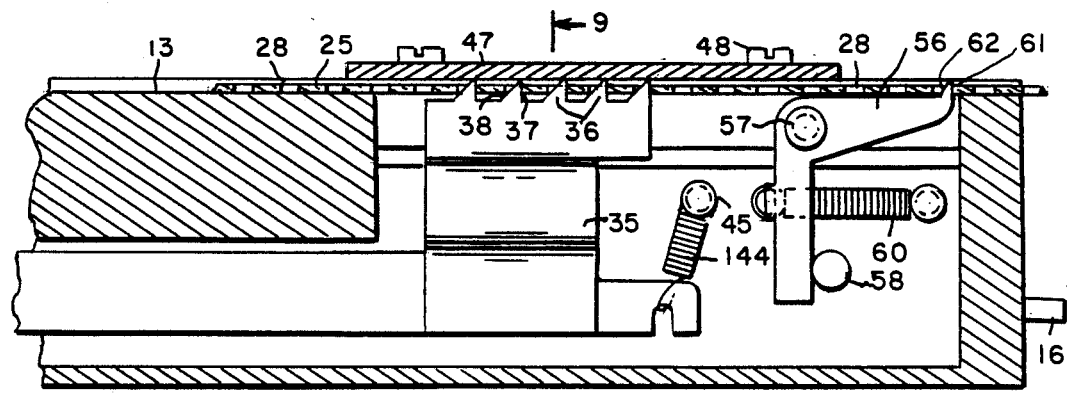
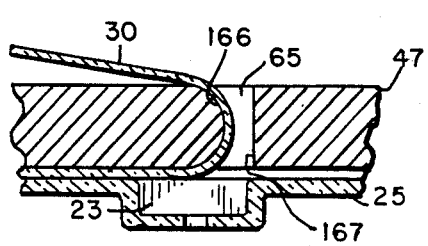
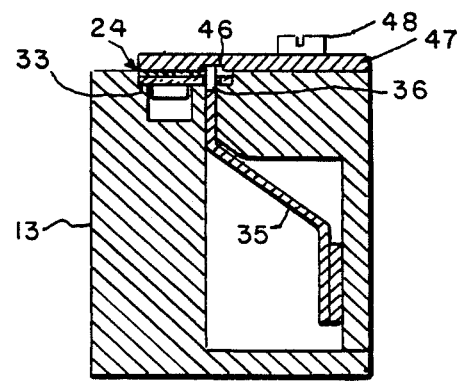

4,943,342

COMPONENT FEEDING DEVICE FOR CIRCUIT BOARD MOUNTING APPARATUS

BACKGROUND OF THE INVENTION

1. Field of the Invention

This invention relates to apparatus for automatically assemblying electronic components on printed circuit boards and has particular reference to a feeding device for feeding such components to a pickup station from which the components are transported by a "pick and place" device to a specific location on the surface of a printed circuit board.

2. Description of The Prior Art

Component placement apparatus are well known in which electronic components, such as diodes, resistors, capacitors and the like are surface mounted in desired locations on a printed circuit board preparatory to bonding the same to selected circuit conductors on the board. The components are generally of miniature size and are mounted along a transport tape which is incrementally advanced to feed the components, one at a time, to the pickup station. The transport tape generally comprises a flexible carrier strip having receptacles formed therealong to contain the components and a retainer or cover strip adhesively secured to the carrier strip. Just prior to reaching the pickup station the cover strip is stripped from the carrier tape to permit removal of the uncovered component by the "pick and place unit".

Generally, a relatively large number of feeding devices carrying respective component transport tapes are mounted on one or more carriages which are stepped along a path to sequentially position different ones of the feeding devices at the pickup station. Since the components must be precisely located at the pickup station, a high degree of accuracy must be maintained in positioning the feeding devices and in advancing the transport tapes.

One of the problems encountered in feeding such transport tapes is that since the tapes usually are made of relatively flexible and very thin material, such as plastic, they tend to stretch or distort when operated at high intermittent speeds and thus become inaccurate in placement of the components at the pickup station. This is accentuated by variation in tension in the tapes resulting from stripping the cover strip from the carrier strip.

Although prior feeding devices have been generally satisfactory, they are relatively complicated and expensive to manufacture and tend to become unreliable at higher speeds. Also, since a large number of feeding devices are usually required to provide different sizes and types of components for a typical circuit board, the cost of such component feeding devices is of paramount importance.

SUMMARY OF THE INVENTION

A principal object of the invention is to provide a component feeding device of the above type which is simple and economical to manufacture but yet is highly reliable particularly at high speeds.

Another object of the invention is to provide a component feeding device of the above type which is capable of successively positioning components in precisely located positions at a pickup station at relatively high speeds.

Another object is to provide means for applying an even stripping tension to the cover strip of a tranport tape during high speed intermittent advancment of the components to the pickup station.

Anoher object of the invention is to provide means for pretensioning the cover strip of a transport tape following installation of the tape.

BRIEF DESCRIPTION OF THE DRAWINGS

The manner in which the above and other objects of the invention are accomplished will be readily understood on reference to the following specification when read in conjunction with the accompanying drawings, wherein:

FIG. 1 is a side view, partly broken away, of a component Feeding device embodying a preferred form of the present invention.

FIG. 2 is a sectional view showing the adjustable feed limit stop and is taken along line 2—2 of FIG. 1.

FIG. 3 is a sectional view through the tape feed stroke adjustment and is taken along line 3—3 of FIG. 1.

FIG. 4 is a sectional view of the takeup reel and is taken along line 4—4 of FIG. 1.

FIG. 5 is a sectional view partly showing the yieldable drive for the takeup reel and is taken along line 5—5 of FIG. 4.

FIG. 6 is a perspective view of a section of a typical component transfer tape showing a portion of the cover strip stripped from the carrier strip.

FIG. 7 is an enlarged plan view of part of the tape feed and guide block.

FIG. 8 is a longitudinal sectional view of the feed and guide block and is taken along line 8—8 of FIG. 7.

FIG. 9 is a transverse sectional view taken along line 9—9 of FIG. 8.

FIG. 10 is an enlarged sectional view through part of the stripper plate and is taken along line 10—10 of FIG. 7.

DESCRIPTION OF THE PREFERRED EMBODIMENT

While this invention is susceptible to embodiment in different forms, there is shown in the drawings, and will be described, a certain embodiment, with the understanding that the present disclosure is to be considered as an exemplification of the principles of the invention and is not intended to limit the invention to the embodiment illustrated. The scope of the invention will be pointed out in the appended claims.

Referring to the drawings, the component tape feeding device is shown generally at 11 and comprises a vertical base plate 12 to which is secured a tape guide and feed block 13.

The feeder 11 is removably secured to a feeder support carriage, of which only parts 14 and 15 are shown in section. The latter carriage forms part of a circuit board assemblying machine (not shown). Locater pins 16 extending from the block 13 fit in sockets formed in the carriage part 15 while a bracket 17 secured to the base plate 12 is removably secured to the carriage part 14 by a screw 18.

A number of feeding devices similar to device 11 may be mounted side by side on the carriage and the latter is arranged to be stepped in a path perpendicular to the plane of FIG. 1 to selectively position different ones of the feeding devices in line with a pickup station or point P and with an actuator 20, the latter being suitably mounted on the machine and provided with a yieldable vertically reciprocal plunger 19. A "pick and place"

head, partly shown at 22, is carried by the machine and is normally located at the pickup station P. At a predetermined point in the operation of the machine, the head 22, using vacuum, picks an electronic component 23 (FIGS. 6 and 7) from the carrier strip 25 of a transport tape 24 at the pickup station P and transports it to a specific location on a circuit board (not shown).

Circuit board assemblying machines of the aforementioned type are well known in the art. One such machine is commercially available from the firm of W. T. Automation located in Palm Bay, Fla.

The carrier strip 25, which is of a thin, flexible material, such as plastic, has a series of spaced receptacle formations 26 therein in which are removably fitted the electronic components 23, such as diodes, resistors, capacitors or the like. A series of feed apertures 28 are formed along one side of the strip 25 and a retainer or cover strip 30, also of thin, flexible plastic or other flexible material, is removably secured by a suitable weak adhesive, over the surface of the strip 25 to retain the components 23 in place.

According to the present invention, the transport tape 24 is wound on a supply reel 29 which is rotatably mounted on a frame pin 31 fixed to the base plate 12. A suitable drag device (not shown) is preferably provided to prevent overrunning of the reel as the tape is withdrawn therefrom.

The tape 24 is guided under a stationary curved guide 32 secured to the base plate 12 and is led onto a guideway 33 (FIGS. 7 and 9) formed in the upper surface of the guide block 13.

For the purpose of intermittently advancing the tape 24 toward the pickup station P, a feed pawl 35 (FIGS. 1, 8 and 9) is provided having a plurality of drive teeth 36 engageable in the feed apertures 28. The teeth 36 have vertical driving edges 37 and inclined rear edges 38. The pawl 35 is connected through an adjustable pivot connection 39, to be described later, to an actuator lever 40 pivotally mounted on a frame and normally held in its illustrated counterclockwise rocked position against a frame stud 42 by a tension spring 43 tensioned between the lever 40 and a frame stud 44.

A tension spring 144 extends between the right hand end of the pawl 35 and a frame stud 45 to yieldably hold the pawl in its upper illustrated position wherein the teeth 36 extend into the feed perforations and their tips rest against the bottom of a guide channel 46 formed in a stripper plate 47 secured to the top of the guide block by screws 48. The teeth fully engage in the perforations 28. The plate 47 cooperates with the guideway 33 to guide the tape 24 toward the station P.

The feed pawl 35 is reciprocated to intermittently advance the tape 24 toward the pickup station P by the aforementioned actuator 20 whose plunger 19 is yieldably reciprocated vertically to rock the lever 40 clockwise against the action of the weaker spring 43 from its full line position of FIG. 1 to its dotted line position 40a wherein it limits against an adjustable stop 50 (see also FIG. 2). The latter has a cylindrical body 49 formed with an eccentrically located bearing formation 51 which is frictionally mounted in a mating bearing formed in the base plate 12. Thus, by rotatably adjusting the stop 50, the limit of feeding movement of the tape may be precisely controlled.

The adjustable pivot connection 39 (FIG. 3) comprises a spool 52 rotatably mounted in a bearing formed in the lever 40, the spool having an eccentrically located hole 53 therein to receive a clamp screw 54 threaded into the pawl 35 to clamp the spool in different adjusted positions relative to the pawl. Thus, the extent of feeding movement of the pawl may be precisely controlled.

During leftward retraction of the pawl 35, the inclined rear edges of the teeth 36 cam the pawl out of engagement with the holes 28 and this, along with other forces, tend to retract the tape 24. This is prevented by a detent pawl 56 located directly adjacent the pickup station P. Pawl 36 is pivoted on a frame stud 57 extending from the block 13 and is normally held in its illustrated detenting position against a limit stud 58 by a tension spring 60. The pawl 56 is provided with a detent tooth having a vertical forward edge 61 and an inclined rear edge 62.

As the tape 24 is advanced to locate a new component 23 at the pickup station, the detent pawl snaps into engagement with an aligned feed perforation 28 to prevent retrograde movement of the tape but during advancing movement the edge of the engaged perforation cams against the rear edge 62 of the pawl, thus rocking the same out of the way until it can again snap into the next succeeding feed aperture. The stud 58 prevents the tooth 61 from becoming fully engaged in the feed perforations.

As noted heretofore, the cover strip 30 is removed from the carrier strip 25 as a new component 23 is advanced to the pickup station P. For this purpose, a guide slot 65 (see also FIG. 10) is formed in the stripper plate 47, through which the cover strip 30 is guided in separating from the carrier strip 25. The slot 65 is formed with a hole 165 at one end to facilitate forming a rounded guide edge 166 to reduce friction between the cover strip and the stripper plate and thus prevent breakage of the strip 30. The opposite edge 167 of the slot 65 is formed vertically to prevent the leading edge of a component 23 from coming out of its receptacle 26 as the cover strip is being stripped. The strip 30 is then led at an acute angle under a guide roller 66 and onto a takeup reel 67.

Referring to FIGS. 1, 4 and 5, the takeup reel 67 is rotatably mounted on a frame pin 68 secured to the base plate 12 and comprises a hub 70 to which spaced reel flanges 71 and 72 are suitably secured.

The takeup reel 67 is yieldably rotated counterclockwise to accumulate the cover strip 30 thereon and for this purpose a cog belt 74 is partly wrapped, at its lower end, around a cog wheel 75 and, at its upper end, is partly wrapped around the smooth surface of the hub 70.

The cog wheel 75 is rotatably mounted on a frame pin 78 and has a large diameter section 80 which is preferably knurled at 81 around its periphery. The section 80 lies at least substantially tangent to the tape 24 as it is guided onto the guideway 23 in block 13.

A pressure roller 82 is provided to frictionally maintain the tape 24 in driving engagement with the large diameter section 80 of the cog wheel. For this purpose, the roller 82 is rotatably mounted on a lever 83 pivotally supported on a frame pin 84 and urged counterclockwise by a relatively stiff spring 85 tensioned between a frame stud 86 and the lever 83.

It is essential that a constant tension be applied to the cover strip 30 as it accumulates in an ever increasing roll 69 on the takeup reel 67 to prevent breaking of the strip or providing an uneven drag against the tape which might otherwise result in minute but unwanted misplacement of a component 23 at the pickup station P.

For this reason, the belt 74 is of such a length that it would normally slip as it passes over the reel hub 70 of the takeup reel, and in order to maintain it in constant but yieldable frictional driving engagement with the hub, a belt tightening roller 88 is provided, being rotatably carried by a lever 90 pivoted on a frame pin 93 and urged counterclockwise by a spring 92. (FIG. 1). The latter is tensioned between the lever and a frame stud 93. The roller is arranged to press against the reel driving belt strand 76 to normally deflect the same inwardly toward the non-driving belt strand 77.

The cog wheel 75 is of such diameter that it always tends to drive the belt 74 at a greater speed than permitted by the cover strip regardless of the accumulated diameter of the takeup roll 69. Thus, the roller tensions the belt strand 76 and as the resulting torque is applied to the hub 70, the strand 76 tends to straighten out, moving the roller 88 and its lever 90 clockwise a minute amount. This results in a slight lessening of tension in the belt strand 77 permitting increased slippage between the belt and the hub 70 as the roller 88 again deflects the strand 76 inward toward the strand 76. This varying clutch action of the belt against the hub 70 proceeds smoothly as the as the diameter of the takeup roll 69 increases.

When initially mounting a new transport tape 24 on the feeding device, the lever 90 is manually swung clockwise to release the takeup reel 67 from the belt 74 so that the reel can be readily manually rotated to thread the leading edge of the strip 30 onto the takeup reel 67.

It is essential that a predetermined amount of tension be applied to the strip following installation and before operation of the feeding device begins.

For this reason, the tension roller 88 is located to engage the driving belt strand 76 directly adjacent the reel hub 70. Thus, when the spring 92 is released to force the roller 88 against the belt strand 76 following installation of a new tape 24, the latter will slightly increase the amount of its wrapping engagement around the hub and in so doing, the belt will apply a small yieldable counterclockwise rotation to the takeup reel to take up any inital slack which may exist in the cover strip 30.

I claim:

1. A device for intermittently feeding components to a pickup station of a component assemblying apparatus having a reciprocating actuator, said components being carried by a transport tape having feed perforations there along, comprising
    a tape guide member,
    a feed pawl reciprocated by said actuator,
    a drive tooth on said pawl,
    spring means urging said pawl to extend said tooth through a said perforation and into guided engagement with said guide member,
    said tooth having a driving edge engagable in a said perforation for driving said tape during advancement of said pawl and a camming edge engagable with an edge of said last mentioned perforation during return of said pawl whereby to disengage said tooth from said perforation.

2. A device as defined in claim 1 comprising a detent pawl, means for urging said detent pawl into engagement with said tape, said detent pawl having a detenting edge engagable in a said perforation to prevent retrograde movement of said tape from said station and a camming edge engagable by said last mentioned perforation during advancement of said tape toward said station for moving said pawl out of detenting engagement with said last mentioned perforation.

3. A device for intermittently feeding components to a pickup station of a component assemblying apparatus having a reciprocating actuator, said components being carried along a transport tape, said tape including a component carrying strip having feed perforations therealong and a retainer strip removably attached to said carrier strip which comprises
    means for guiding said tape toward said station,
    a feed pawl having a drive tooth engagable with said perforations,
    drive means operable by said actuator during advancement thereof for advancing said pawl to drive said tape toward said station,
    means comprising a tape guide member,
    spring means urging said pawl to extend said tooth through a said perforation and into guided engagement with said guide member,
    a detent pawl having a detent tooth,
    spring means urging said detent pawl to extend said detent tooth through a said perforation, and
    means including said guide member for stripping said retainer strip from said carrier strip and for drawing said retainer strip over said guide member.

4. In a component assemblying apparatus having means for intermittently feeding a component transport tape toward a component pickup station, said tape including a component carrier strip and a component retainer strip removably attached to said carrier strip;
    a device for stripping said retainer strip from said carrier strip
    comprising
    a takeup reel for said retainer strip,
    a pulley connected to said reel,
    a cog wheel,
    mean for rotating said cog wheel,
    a cog belt having a driving strand and a driven strand,
    said belt being loosely wrapped over said pulley and in
    driving connection with said cog wheel, and
    a belt tensioning device for yieldably varying the tension in said driving strand whereby to vary the torque applied to said pulley by said belt in accordance with the drag imposed on said retainer strip upon stripping said retainer strip from said carrier strip.

5. A device as defined in claim 4 wherein said last mentioned means comprises means for deflecting said driving strand different amounts around said pulley.

6. A device as defined in claim 4 wherein said rotating means comprises means driven by said tape.

7. A device as defined in claim 4 wherein said belt tensioning means comprises spring means for deflecting said driving strand toward said driven strand whereby to wrap said belt different amounts around said pulley.

8. A device as defined in claim 4 wherein said belt tensioning means comprises spring means for deflecting said driving strand toward said driven strand to yieldably advance said pulley whereby to tense said retainer strip.

* * * * *